(12) United States Patent
Yamaguchi et al.

(10) Patent No.: US 9,773,527 B2
(45) Date of Patent: Sep. 26, 2017

(54) SEMICONDUCTOR DEVICE

(71) Applicant: TOSHIBA MEMORY CORPORATION, Minato-ku (JP)

(72) Inventors: Itaru Yamaguchi, Yokohama (JP); Masaru Koyanagi, Ota (JP); Hiroaki Nakano, Kawaguchi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 14/657,345

(22) Filed: Mar. 13, 2015

(65) Prior Publication Data
US 2016/0078906 A1    Mar. 17, 2016

Related U.S. Application Data

(60) Provisional application No. 62/049,730, filed on Sep. 12, 2014.

(51) Int. Cl.
*G11C 8/00*    (2006.01)
*G11C 5/02*    (2006.01)
(Continued)

(52) U.S. Cl.
CPC ............... *G11C 5/025* (2013.01); *G11C 8/12* (2013.01); *G11C 16/20* (2013.01); *G11C 5/148* (2013.01); *G11C 2029/4402* (2013.01); *H01L 23/3135* (2013.01); *H01L 25/0657* (2013.01); *H01L 2224/0401* (2013.01); *H01L 2224/0557* (2013.01); *H01L 2224/13025* (2013.01); *H01L 2224/16145* (2013.01);
(Continued)

(58) Field of Classification Search
CPC .................................... G11C 5/02; G11C 8/12
USPC ................................................ 365/63, 230.03
See application file for complete search history.

(56) References Cited

U.S. PATENT DOCUMENTS 6,721,196 B1    4/2004 Grassl
7,102,905 B2    9/2006 Funaba et al.
(Continued)

FOREIGN PATENT DOCUMENTS

JP    2003-503834    1/2003
JP    4205553    1/2009
(Continued)

OTHER PUBLICATIONS

Office Action dated Jan. 21, 2016 in Taiwanese Patent Application No. 103139103 (with English language translation).
(Continued)

*Primary Examiner* — Anthan Tran
(74) *Attorney, Agent, or Firm* — Oblon, McClelland, Maier & Neustadt, L.L.P.

(57) ABSTRACT

According to one embodiment, electrodes are provided in stacked M (M is an integer of 2 or more) semiconductor chips, a transmission units are provided for the semiconductor chips and, based on a chip identification information on a semiconductor chip in the present stage, transmits the chip identification information on a semiconductor chip in the next stage via the electrodes, or transmit a data for setting the chip identification information, and the direction in which an external signal is sent via the electrodes is opposite to the direction in which the chip identification information is transmitted via the electrodes.

5 Claims, 5 Drawing Sheets

(51) Int. Cl.
    *G11C 8/12*     (2006.01)
    *G11C 16/20*     (2006.01)
    *H01L 25/065*     (2006.01)
    *G11C 5/14*     (2006.01)
    *H01L 23/31*     (2006.01)
    *G11C 29/44*     (2006.01)

(52) U.S. Cl.
    CPC ............... *H01L 2224/16146* (2013.01); *H01L 2224/1703* (2013.01); *H01L 2224/17181* (2013.01); *H01L 2224/32145* (2013.01); *H01L 2224/32225* (2013.01); *H01L 2224/32245* (2013.01); *H01L 2224/3303* (2013.01); *H01L 2224/33051* (2013.01); *H01L 2224/33181* (2013.01); *H01L 2224/73203* (2013.01); *H01L 2224/73204* (2013.01); *H01L 2224/73253* (2013.01); *H01L 2225/06513* (2013.01); *H01L 2225/06517* (2013.01); *H01L 2225/06541* (2013.01); *H01L 2225/06589* (2013.01); *H01L 2924/15311* (2013.01)

(56) References Cited

U.S. PATENT DOCUMENTS

| | | |
|---|---|---|
| 8,076,764 B2 | 12/2011 | Yamada et al. |
| 8,709,871 B2 | 4/2014 | Yamada et al. |
| 2007/0126105 A1 | 6/2007 | Yamada et al. |
| 2010/0027309 A1* | 2/2010 | Park .................... G11C 5/02 365/63 |
| 2011/0079924 A1* | 4/2011 | Suh ..................... G11C 5/00 257/777 |
| 2012/0007624 A1* | 1/2012 | Byeon .................. G11C 7/10 324/750.15 |
| 2012/0122251 A1 | 5/2012 | Yamada et al. |
| 2014/0062587 A1 | 3/2014 | Koyanagi |
| 2014/0306753 A1* | 10/2014 | Jeong ................ H01L 27/0203 327/565 |

FOREIGN PATENT DOCUMENTS

| | | |
|---|---|---|
| JP | 2013-507773 | 3/2013 |
| JP | 2014-53055 | 3/2014 |
| TW | I317126 B | 11/2009 |
| WO | WO 2011/044385 A2 | 4/2011 |

OTHER PUBLICATIONS

Combined Taiwanese Office Action and Search Report dated Jun. 27, 2016 in Patent Application No. 103139103 (with partial English translation and English translation of Categories of Cited Documents).

* cited by examiner

SEMICONDUCTOR DEVICE

CROSS-REFERENCE TO RELATED APPLICATIONS

This application is based upon and claims the benefit of priority from U.S. Provisional Application No. 62/049,730, filed on Sep. 12, 2014; the entire contents of which are incorporated herein by reference.

FIELD

Embodiments described herein relate generally to a semiconductor device.

BACKGROUND

For space saving in a semiconductor device, semiconductor chips may be stacked. There is a semiconductor device using through electrodes called TSV (Through Silicon Via) for making electric connection of stacked semiconductor chips. At such a semiconductor device using TSVs, the semiconductor chips may hold chip identification information to identify in which layer a semiconductor chip in the present stage resides.

DETAILED DESCRIPTION

In general, according to one embodiment, a semiconductor device includes stacked M (M is an integer of 2 or more) semiconductor chips, electrodes, and transmission units. The electrodes are provided in the semiconductor chips to connect electrically the semiconductor chips in the direction of stacking. The transmission units are provided for the semiconductor chips. Based on a chip identification information on a semiconductor chip in the present stage, the transmission unit transmit the chip identification information on a semiconductor chip in the next stage via the electrodes, or transmit a data for setting the chip identification information. At that time, the direction in which an external signal is sent via the electrodes is opposite to the direction in which the chip identification information is transmitted via the electrodes.

Exemplary embodiments of a semiconductor device will be explained below in detail with reference to the accompanying drawings. The present invention is not limited to the following embodiments.

Figure 1:
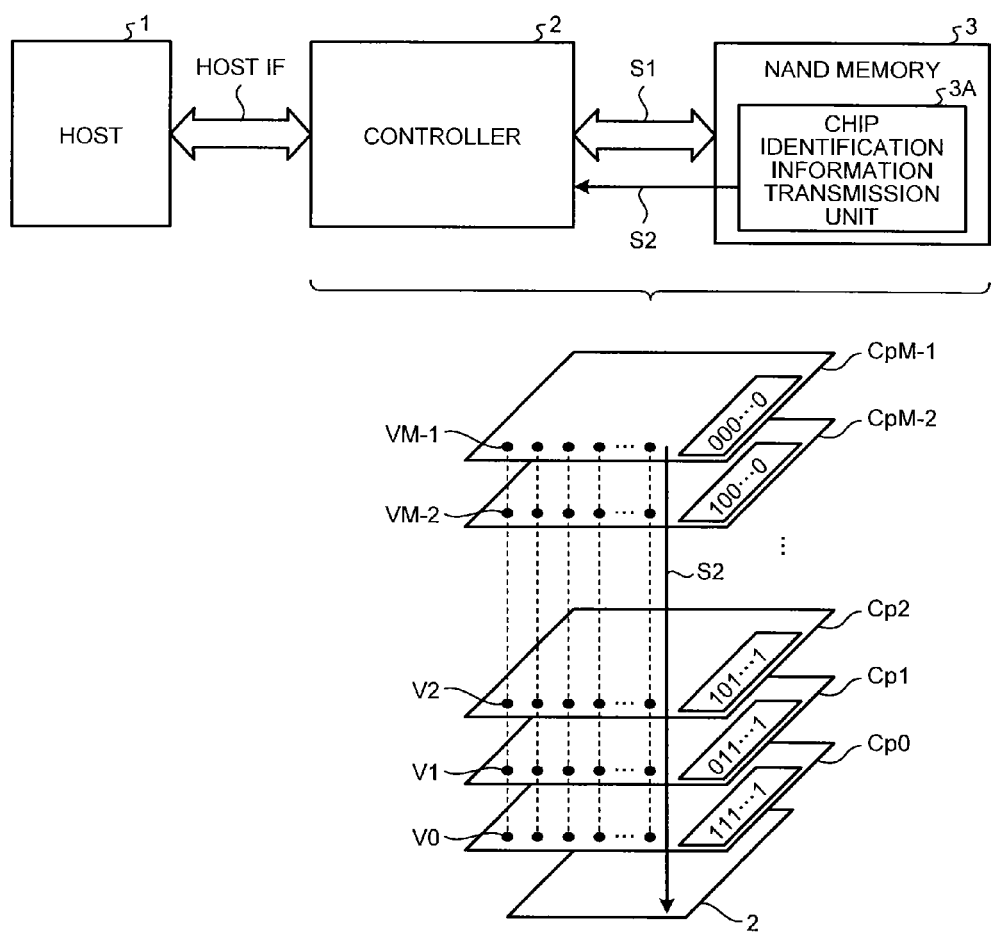
FIG. 1 is a schematic block diagram of a semiconductor device according to a first embodiment.

FIG. 1 is a schematic block diagram of a semiconductor device according to a first embodiment. In the following embodiment, a non-volatile semiconductor device is taken as an example of the semiconductor device, and a NAND memory is taken as an example of the non-volatile semiconductor device.

Referring to FIG. 1, the non-volatile semiconductor device is provided with a NAND memory 3 and a controller 2. The NAND memory 3 is connected to the controller 2. The controller 2 is connected to a host 1 via a host IF. The NAND memory 3 can store data to be handled at the host 1. The NAND memory 3 may be mounted in an SSD, an SD card, or a USB memory, for example. The controller 2 can perform drive control on the NAND memory 3. The drive control on the NAND memory 3 includes read/write control, block selection, error correction, wear leveling, and the like relative to the NAND memory 3. The host 1 may be a personal computer, an electronic device such as a digital camera, or a mobile terminal such as a smart phone.

The NAND memory 3 includes M (M is an integer of 2 or more) semiconductor chips Cp0 to CpM−1 stacked in sequence. The semiconductor chips Cp0 to CpM−1 have respective through electrodes V0 to VM−1 provided therein to connect electrically the semiconductor chips Cp0 to CpM−1 in the direction of stacking. The controller 2 is connected to the semiconductor chip Cp0 situated in the bottom layer (or the top layer) via the through electrodes V0 to VM−1. The controller 2 can output an external signal S1 to the NAND memory 3 via the through electrodes V0 to VM−1. The external signal S1 may be an address latch enable signal ALE, command latch enable signal CLE, read enable signals /RE (/ denotes a low active signal) and RE, write enable signal /WE, data signal DQ, data strobe signal DQS and /DQS, chip enable signal /CE, write protect signal /WP, ready/busy signal RB, chip address CADD, or the like, for example. The controller 2 uses these signals S1 to control the NAND memory 3.

The NAND memory 3 also includes a transmission unit 3A. The transmission unit 3A can be provided for each of the semiconductor chips Cp0 to CpM−1. The transmission unit 3A, based on chip identification information on a semiconductor chip in the present stage, can transmit chip identification information (or data for setting chip identification information) on a semiconductor chip in the next stage via the through electrodes V0 to VM−1. At that time, the direction in which the external signal S1 is sent between the semiconductor chips Cp0 to CpM−1 via the through electrodes V0 to VM−1 is set opposite to the direction in which chip identification information S2 is transmitted via the through electrodes V0 to VM−1. Specifically, the chip identification information S2 is transmitted from the semiconductor chip CpM−1 in the top layer to the semiconductor chip Cp0 in the bottom layer (or from the semiconductor chip Cp0 in the bottom layer to the semiconductor chip CpM−1 in the top layer).

At that time, N (N is an integer of 2 or more) through electrodes V0 to VM−1 for use in transmission of the chip identification information S2 can be provided on each of the semiconductor chips Cp0 to CpM−1. The number N can be set to be equal to or more than the number of bits by which the M semiconductor chips Cp0 to CpM−1 can be identified. When 16 semiconductor chips Cp0 to Cp15 are stacked, the number N can be set to 4 or more.

The host IF is changed according to an application to which the NAND memory 3 is applied. When the NAND memory 3 is applied to an SSD (Solid-State Drive), SAS (Serial Attached SCSI), SATA (Serial ATA), and PCIe (Programmable Communications Interface Express) are used. When the NAND memory 3 is applied to a USB (Universal Serial Bus) memory or the like, USB is used. When the NAND memory 3 is applied to eMMC (Embedded Multi- Media Card), an eMMC-based interface is used. When the NAND memory 3 is applied to an SD card, an SD memory-based interface is used.

Upon receipt of a request signal from the host 1 via the host IF, the controller 2 generates a chip enable signal /CE, command latch enable signal CLE, address latch enable signal ALE, write enable signal /WE, read enable signal /RE, write protect signal /WP, or the like, according to the request signal.

When data is to be written into the NAND memory 3 according to the request signal from the host 1, the controller 2 supplies the data to the NAND memory 3 via a channel.

When data is to be read from the NAND memory 3 in response to the host 1 according to the request signal from the host 1, the controller 2 receives the data from the NAND memory 3 via the channel.

The transmission unit 3A keeps the chip identification information S2 for the M semiconductor chips Cp0 to CpM−1 in the reset state at transmission of the chip identification information S2. Then, the transmission unit 3A cancels the reset state of the chip identification information S2 upon detection of power-on. When the reset state of the chip identification information S2 is canceled, the semiconductor chip in the present stage counts up its chip identification information S2 and then transmits the same to the semiconductor chip in the next stage. At that time, the transmission unit 3A can invert bit information corresponding to the through electrode in the N-th stage, according to the transmission of bit information for $2^{N-1}$ layers between the semiconductor chips Cp0 to CpM−1. For example, in the semiconductor chip CpM−1, information '000 . . . 0' is generated and held as the chip identification information S2. Also in the semiconductor chip CpM−1, the information '000 . . . 0' is counted up to generate information '100 . . . 0' as the chip identification information S2, and the information '100 . . . 0' is transmitted to the semiconductor chip CpM−2. Then, the information '100 . . . 0' is held in the semiconductor chip CpM−2. Also in the semiconductor chip CpM−2, the information '100 . . . 0' is counted up to generate information '010 . . . 0' as the chip identification information S2, and the information '010 . . . 0' is transmitted to the semiconductor chip CpM−3.

Finally, in the semiconductor chip Cp1, information '011 . . . 1' is counted up to generate information '111 . . . 1' as the chip identification information S2, and the information '111 . . . 1' is transmitted to the semiconductor chip Cp0. Then, the information '111 . . . 1' is held in the semiconductor chip Cp0. In addition, the information '111 . . . 1' held in the semiconductor chip Cp0 is sent to the controller 2. The controller 2 thus can recognize the number of layers of the semiconductor chips Cp0 to CpM−1 based on the information '111 . . . 1.' The controller 2 can also verify the path for the transmission unit 3A based on the information '111 . . . 1.' The semiconductor chips Cp0 to CpM−1 each can perform control such as channel switching for the external signal S1 based on its chip identification information S2.

Since the direction in which the external signal S1 is sent between the semiconductor chips Cp0 to CpM−1 via the through electrodes V0 to VM−1 is set opposite to the direction in which the chip identification information S2 is transmitted via the through electrodes V0 to VM−1, the controller 2 can check the chip identification information S2 on the semiconductor chip Cp0 in the final stage only by transmitting the chip identification information S2 in the one direction. This eliminates the need to send back in the opposite direction the chip identification information S2 on the semiconductor chip Cp0 in the final stage to send the chip identification information S2 on the semiconductor chip Cp0 in the final stage to the controller 2. Accordingly, there also is no need to provide the semiconductor chips Cp0 to CpM−1 with other paths for sending back in the opposite direction the chip identification information S2 on the semiconductor chip Cp0 in the final stage. This makes it possible to reduce the circuit size and prevent erroneous determination on the chip identification information S2 that could result from defects in the other paths.

Figure 2:
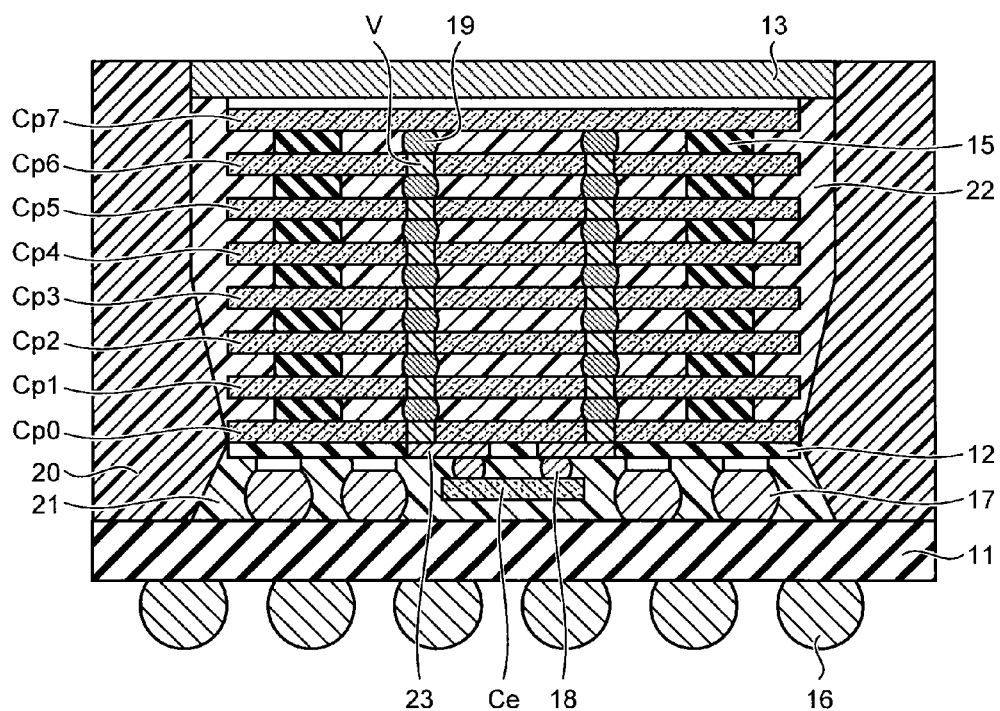
FIG. 2 is a cross-sectional view of a configuration example of a controller and a NAND memory illustrated in FIG. 1.

FIG. 2 is a cross-sectional view of a configuration example of the controller and the NAND memory illustrated in FIG. 1. FIG. 2 indicates the case where M is 8.

Referring to FIG. 2, the semiconductor chips Cp0 to Cp7 are sequentially stacked and mounted on a support substrate 12. Through electrodes V are provided in the semiconductor chips Cp0 to Cp7. The through electrodes V are connected between the semiconductor chips Cp0 to Cp7 via solder balls 19. The semiconductor chips Cp0 to Cp7 are vertically connected via adhesive layers 15.

A controller chip Ce1 is mounted on the back surface of the support substrate 12. Wiring 23 is formed on the support substrate 12. The controller chip Ce1 is connected to the wiring 23 via solder balls 18. The controller chip Ce1 and the semiconductor chips Cp0 to Cp7 are electrically connected through connection of the through electrode V in the semiconductor chip Cp0 in the bottom layer (or the top layer) to the wiring 23. The support substrate 12 is connected to a mounting substrate 11 via solder balls 17. Solder balls 16 are provided on the back surface of the mounting substrate 11 to connect the mounting substrate 11 to a mother substrate.

The controller chip Ce1 is sealed with a sealing resin 21 on the mounting substrate 11. The semiconductor chips Cp0 to Cp7 are sealed with a sealing resin 22 on the support substrate 12. The sealing resins 21 and 22 are sealed at outer peripheries with a sealing resin 20, and the sealing resin 22 is sealed at the upper portion with a metal plate 13.

Figure 3:
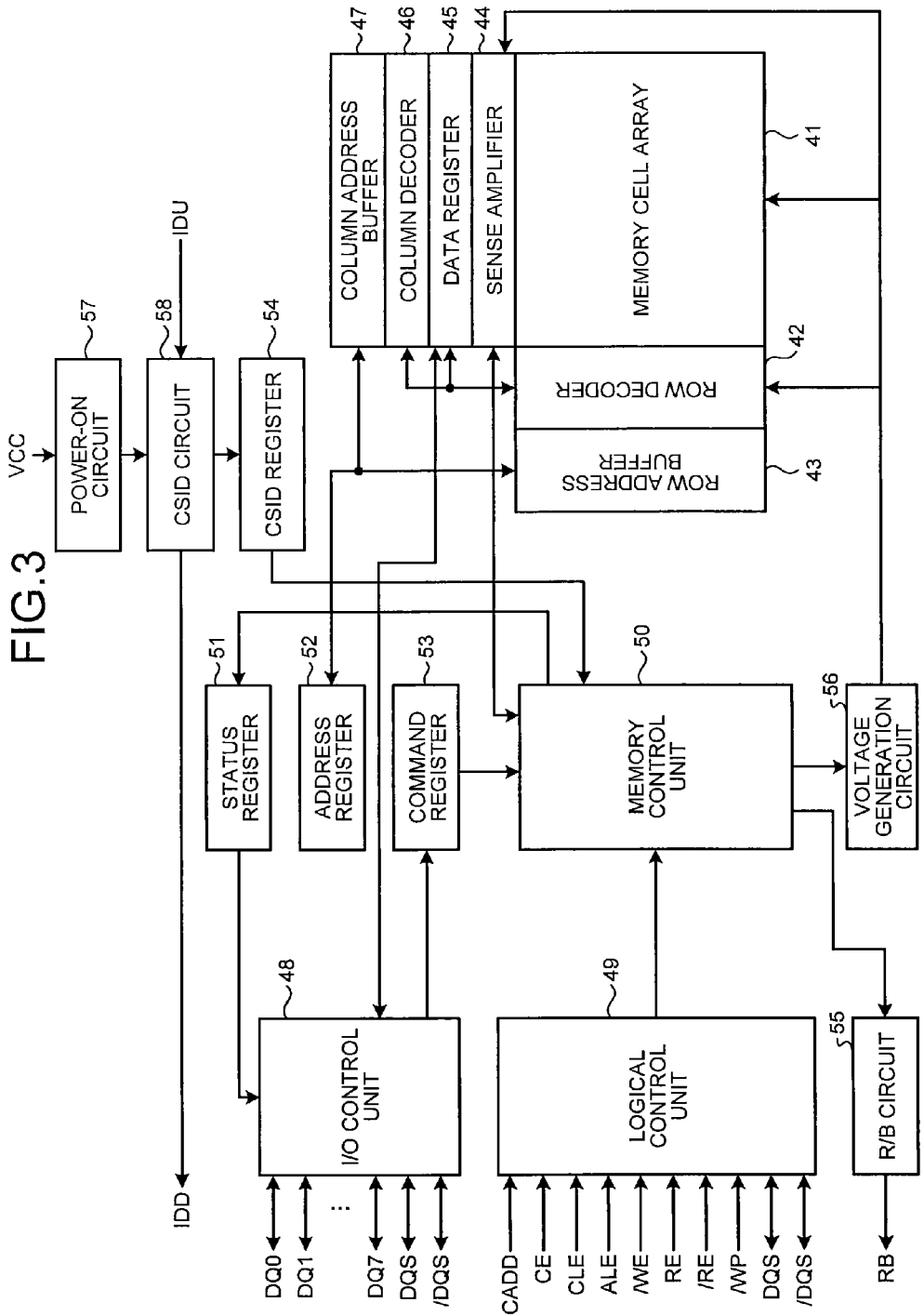
FIG. 3 is a block diagram of a functional configuration of a semiconductor chip illustrated in FIG. 2.

FIG. 3 is a block diagram of a functional configuration of the semiconductor chip illustrated in FIG. 2. FIG. 3 illustrates the semiconductor chip Cp7 as an example, but the same thing is applicable to the semiconductor chips Cp0 to Cp6.

Referring to FIG. 3, the semiconductor chip Cp7 includes a logical control unit 49, memory control unit 50, memory cell array 41, row address buffer 43, row decoder 42, sense amplifier 44, data register 45, column decoder 46, column address buffer 47, voltage generation circuit 56, input/output (I/O) control unit 48, command register 53, address register 52, status register 51, CSID register 54, ready/busy (R/B) circuit 55, power-on circuit 57, and CSID circuit 58.

Supplied from the controller 2 to the logical control unit 49 are a chip enable signal /CE, command latch enable signal CLE, address latch enable signal ALE, write enable signal /WE, read enable signals RE and /RE, write protect signal /WP, data strobe signals DQS and /DQS, and chip address CADD. The commands, address, and data are supplied from the controller 2 to the I/O control unit 48 via signal lines DQ0 to DQ7. The data strobe signals DQS and /DQS are also supplied to the I/O control unit 48.

The logical control unit 49 controls the memory control unit 50 and the I/O control unit 48 according to the input signal. The command register 53 holds a command output from the I/O control unit 48. The address register 52 holds an address output from the I/O control unit 48.

The memory control unit 50 controls the row decoder 42, the sense amplifier 44, the data register 45, the column decoder 46, the voltage generation circuit 56, and the R/B circuit 55 to control data writing, reading, erasing, and the like according to the command held in the command register 53.

The R/B circuit 55 outputs a ready/busy signal RB according to an output signal from the memory control unit 50. The voltage generation circuit 56 generates a write voltage, a read voltage, an erase voltage, or the like according to an instruction from the memory control unit 50, and supplies these voltages to the memory cell array 41, the row decoder 42, and the sense amplifier 44.

The memory cell array 41 has a plurality of NAND strings. Each of the NAND strings is configured such that first and second selection transistors and a plurality of memory cells are connected in series. The memory cells are provided with charge storage layers and control gate electrodes. The first selection transistor is connected to a bit line and the second selection transistor is connected to a source line. The gate electrodes of the first and second selection transistors are connected to first and second selection lines, and the control gate electrodes of the same are connected to word lines. Each of the bit lines is connected to the sense amplifier 44.

The row address buffer 43 and the column address buffer 47 hold row addresses and column addresses held in the address register 52, respectively. The row decoder 42 decodes the row addresses held in the row address buffer 43, and selects the first and second selection lines and the word line in the memory cell array 41. The column decoder 46 decodes the column addresses held in the column address buffer 47 and selects the bit line in the memory cell array 41.

On data writing, the data register 45 supplies data from the I/O control unit 48 to the sense amplifier 44. On data reading, the data register 45 holds data detected by the sense amplifier 44 from the selected bit line, and supplies the same to the I/O control unit 48.

On data writing, the sense amplifier 44 writes the data held in the data register 45 into a selected memory cell. On data reading, the sense amplifier 44 reads the data from the selected memory cell via the bit line.

The status register 51 holds status data indicating whether writing, reading, and erasing of data output from the memory control unit 50 has been normally completed, for example. The status data held in the status register 51 is supplied to the host 1 via the I/O control unit 48 and the controller 2.

The power-on circuit 57 detects power-on based on a power-supply voltage VCC. Based on chip identification information IDU on the semiconductor chip Cp7 in the present layer, the CSID circuit 58 transmits chip identification information IDD on the semiconductor chip Cp6 in the next layer via the through electrodes V0 to V7. The CSID register 54 holds the chip identification information IDU for identification of the semiconductor chip Cp7. The chip identification information IDU held in the CSID register 54 is supplied to the memory control unit 50.

Then, the CSID circuit 58 maintains the chip identification information IDD in the reset state at transmission of the chip identification information IDD. Upon detection of power-on at the power-on circuit 57, the CSID circuit 58 cancels the reset state of the chip identification information IDD. The semiconductor chip Cp1 counts up the chip identification information IDU to generate chip identification information IDD, and transmits the chip identification information IDU to the semiconductor chip Cp6 and stores the same in the CSID register 54.

Figure 4:
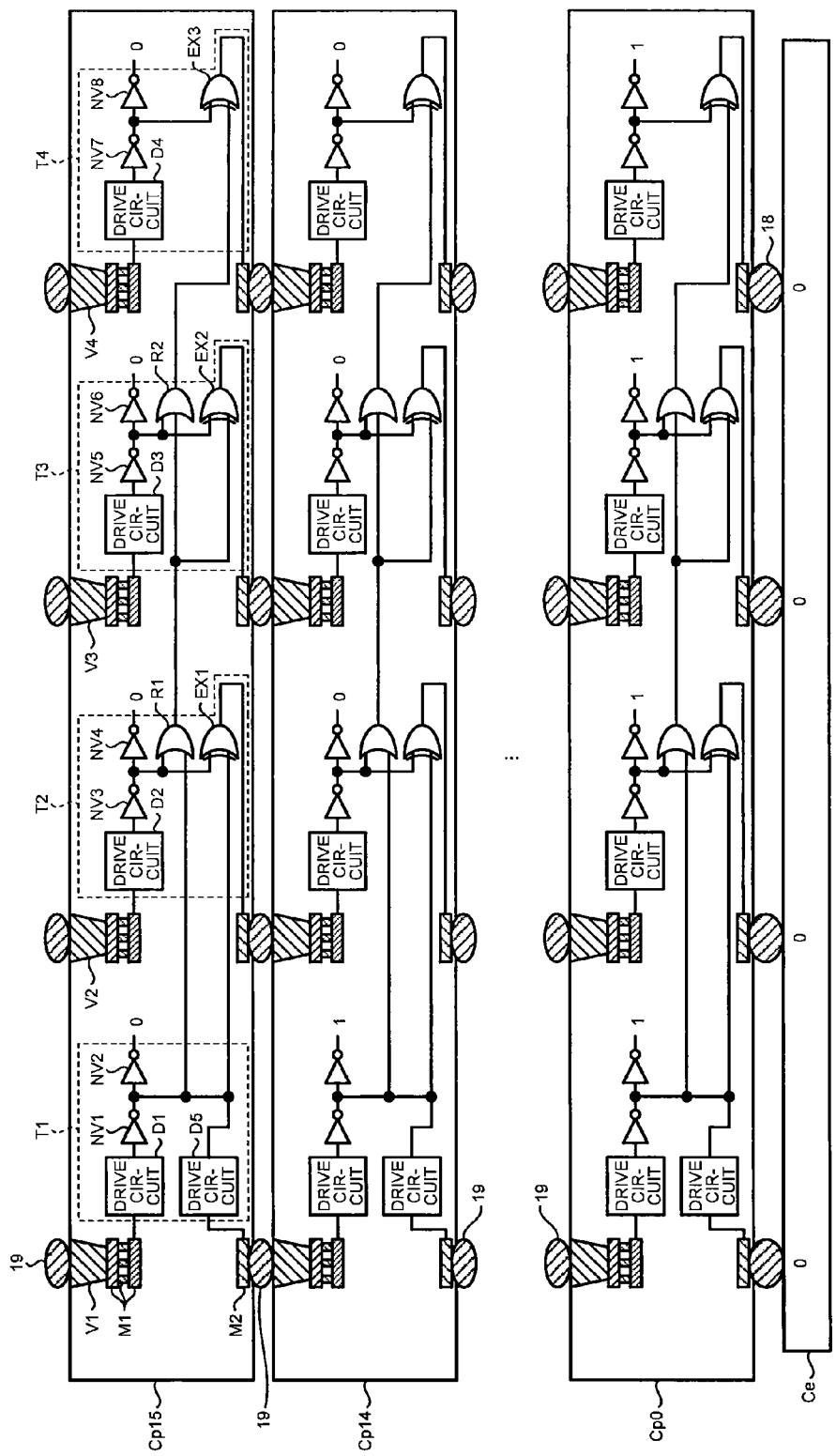
FIG. 4 is a schematic circuit diagram of a transmission unit illustrated in FIG. 1.

FIG. 4 is a schematic circuit diagram of the transmission unit illustrated in FIG. 1. FIG. 4 illustrates the case where the number of layers M of semiconductor chips Cp0 to Cp15 is 16 and the number of bits N by which the number of layers M can be identified is 4.

Referring to FIG. 4, the semiconductor chip Cp15 is provided with four through electrodes V1 to V4 corresponding to the number of bits N=4, for example. The semiconductor chip Cp15 is also provided with decode units T1 to T4 corresponding to the through electrodes V1 to V4. The decode units T1 to T4 store in the CSID register 54 chip identification information sent from the semiconductor chip in the previous stage as chip identification information on the semiconductor chip in the present stage, and count up the chip identification information sent from the semiconductor chip in the previous stage and transmit the same to the semiconductor chip in the next stage. At that time, when it is assumed that the chip identification information is composed of four bits of information, each of the decode units T1 to T4 can take charge of one bit.

The decode unit T1 in the first stage is provided with drive circuits D1, D5 and inverters NV1, NV2. The decode unit T4 in the final stage is provided with a drive circuit D4, inverters NV7, NV8, and an EXOR circuit EX3. The decode unit T2 in the second stage is provided with a drive circuit D2, inverters NV3, NV4, an EXOR circuit EX1, and an OR circuit R1. The decode unit T3 in the third stage is provided with a drive circuit D3, inverters NV5, NV6, an EXOR circuit EX2, and an OR circuit R2. The drive circuits D1 to D5 can keep outputs in the reset state upon detection of power-off. In addition, the drive circuits D1 to D5 can cancel the reset state of outputs and execute transmission of chip identification information upon detection of power-on.

Inputs of the drive circuits D1 to D4 are connected via lower wirings M1 to the through electrodes V1 to V4, respectively. Outputs of the drive circuits D1 to D4 are connected to inputs of the inverters NV1, NV3, NV5, and NV7, respectively. Outputs of the inverters NV1, NV3, NV5, and NV7 are connected to inputs of the inverters NV2, NV4, NV6, and NV8, respectively. Outputs of the inverters NV2, NV4, NV6, and NV8 are connected to the CSID register 54. Connection point of the inverters NV1 and NV2 of the semiconductor chip Cp15 in the upper layer is connected to the through electrode V1 of the semiconductor chip Cp14 in the lower layer via the drive circuit D5 and an upper wiring M2 in sequence. Connection point of the inverters NV3 and NV4 of the semiconductor chip Cp15 in the upper layer is connected to a through electrode V2 of the semiconductor chip Cp14 in the lower layer via a first input of the EXOR circuit EX1 and an upper wiring M2 in sequence. Connection point of the inverters NV5 and NV6 of the semiconductor chip Cp15 in the upper layer is connected to a through electrode V3 of the semiconductor chip Cp14 in the lower layer via a first input of the EXOR circuit EX2 and an upper wiring M2 in sequence. Connection point of the inverters NV7 and NV8 of the semiconductor chip Cp15 in the upper layer is connected to a through electrode V4 of the semiconductor chip Cp14 in the lower layer via a first input of the EXOR circuit EX3 and an upper wiring M2 in sequence. The connection point of the inverters NV1 and NV2 is connected to a first input of the OR circuit R1, and the connection point of the inverters NV3 and NV4 is connected to a second input of the OR circuit R1. The connection point of the inverters NV3 and NV4 is connected to a first input of the OR circuit R2, and the connection point of the inverters NV5 and NV6 is connected to a second input of the OR circuit R2. The connection point of the inverters NV1 and NV2 is connected to a second input of the EXOR circuit EX1, and an output of the OR circuit R1 is connected to a second input of the EXOR circuit EX2, and an output of the OR circuit R2 is connected to a second input of the EXOR circuit EX3.

The drive circuits D1 to D4 keep the outputs in the reset state during power-off, and set the chip identification information to '0000.' The drive circuit D5 keeps the output in the reset state during power-off, and for example, the semiconductor chip Cp15 in the present stage outputs '0' to the through electrode V1 of the semiconductor chip Cp14 in the next stage. Then, upon detection of power-on, the drive circuits D1 to D5 cancel the reset state of the outputs and transmit the chip identification information from the semiconductor chip Cp15 to the semiconductor chip Cp0. Since no bit information is input into the drive circuits D1 to D4 of the semiconductor chip Cp15 in the top layer, the outputs from the drive circuits D1 to D4 are kept at '0000.' Accordingly, the outputs from the inverters NV2, NV4, NV6, and NV8 are kept at '0000,' and the identification information '0000' is given to the semiconductor chip Cp15 in the top layer.

Also at the semiconductor chip Cp15, the output from the drive circuit D1 is inverted at the inverter NV1, and bit information '1' is transmitted to the drive circuit D1, the first input of the OR circuit R1, and the second input of the EXOR circuit EX1 of the semiconductor chip Cp14.

Also at the semiconductor chip Cp15, the output from the drive circuit D2 is inverted at the inverter NV3, and the bit information '1' is transmitted to the second input of the OR circuit R1 and the first input of the EXOR circuit EX1. Accordingly, the output from the EXOR circuit EX1 becomes '0,' and bit information '0' is transmitted to the drive circuit D2 of the semiconductor chip Cp14. In addition, the output from the OR circuit R1 becomes '1,' and the bit information '1' is transmitted to the first input of the OR circuit R2 and the second input of the EXOR circuit EX1.

Also at the semiconductor chip Cp15, the output from the drive circuit D3 is inverted at the inverter NV5, and the bit information '1' is transmitted to the second input of the OR circuit R2 and the first input of the EXOR circuit EX2. Accordingly, the output from the EXOR circuit EX2 becomes '0,' and the bit information '0' is transmitted to the drive circuit D3 of the semiconductor chip Cp14. In addition, the output from the OR circuit R2 becomes '1,' and the bit information '1' is transmitted to the second input of the EXOR circuit EX3.

Also at the semiconductor chip Cp15, the output from the drive circuit D4 is inverted at the inverter NV7, and the bit information '1' is transmitted to the first input of the EXOR circuit EX3. Accordingly, the output from the EXOR circuit EX3 becomes '0,' and the bit information '0' is transmitted to the drive circuit D4 of the semiconductor chip Cp14.

As a result, chip identification information '1000' is transmitted from the semiconductor chip Cp15 to the semiconductor chip Cp14. When, at the semiconductor chip Cp14, the input into the drive circuit D1 becomes '1,' the output from the drive circuit D1 reflects the input into the drive circuit D1, and the outputs from the drive circuits D1 to D4 become '1000.' Accordingly, the outputs from the inverters NV2, NV4, NV6, and NV8 of the semiconductor chip Cp14 become '1000,' and the chip identification information '1000' is given to the semiconductor chip Cp14 in the stage next to the semiconductor chip Cp15.

When the foregoing operations are repeated, chip identification information '0100' is given to the semiconductor chip Cp13, chip identification information '1100' is given to the semiconductor chip Cp12, chip identification information '0010' is given to the semiconductor chip Cp11, chip identification information '1010' is given to the semiconductor chip Cp10, chip identification information '0110' is given to the semiconductor chip Cp9, chip identification information '1110' is given to the semiconductor chip Cp8, chip identification information '0001' is given to the semiconductor chip Cp1, chip identification information '1001' is given to the semiconductor chip Cp6, chip identification information '0101' is given to the semiconductor chip Cp5, chip identification information '1101' is given to the semiconductor chip Cp4, chip identification information '0011' is given to the semiconductor chip Cp3, chip identification information '1011' is given to the semiconductor chip Cp2, chip identification information '0111' is given to the semiconductor chip Cp1, and chip identification information '1111' is given to the semiconductor chip Cp0. In addition, chip identification information '0000' formed by inverting the chip identification information '1111' is sent to the controller Ce.

Figure 5:
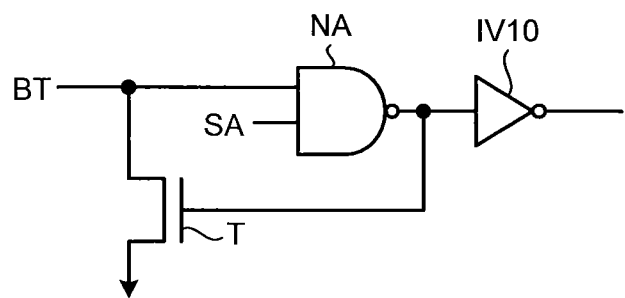
FIG. 5 is a schematic circuit diagram of a drive circuit illustrated in FIG. 4.

FIG. 5 is a schematic circuit diagram of the drive circuit illustrated in FIG. 4. In the following description, the drive circuit D1 is taken as an example.

Referring to FIG. 5, for example, the drive circuit D1 is provided with a NAND circuit NA, a MOS transistor T, and an inverter IV10. The NAND circuit NA takes a negative AND of bit information BT and a power-on detection signal SA received at the through electrode in the present stage. When an output from the NAND circuit NA is applied to a gate, the MOS transistor T pulls down the potential of the through electrode in the present stage.

When the power-on detection signal SA is off, the output from the NAND circuit NA becomes '1,' even if the bit information BT is indefinite. Thus, the MOS transistor T turns on to set the bit information BT to '0.' Meanwhile, when the power-on detection signal SA is on, if the bit information BT is '0,' the output from the NAND circuit NA becomes '1' and the MOS transistor T turns on. Then, when the output from the NAND circuit NA is inverted at the inverter IV10, the output from the drive circuit D1 becomes '0.' When the power-on detection signal SA is on, if the bit information BT is '1,' the output from the NAND circuit NA becomes '0' and the MOS transistor T turns off. Then, when the output from the NAND circuit NA is inverted at the inverter IV10, the output from the drive circuit D1 becomes 1.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:
1. A semiconductor device, comprising:
stacked M semiconductor chips, M being an integer of 2 or more;
electrodes that are provided in the semiconductor chips to electrically connect the semiconductor chips in a direction of stacking; and
transmission units that are provided for the semiconductor chips and, based on a chip identification information of a semiconductor chip in a present stage, transmit the chip identification information to a semiconductor chip in a next stage through the electrodes, or transmit a data for setting the chip identification information, wherein
a direction in which an external signal is sent through the electrodes is opposite to a direction in which the chip identification information is transmitted through the electrodes,
the external signal is outputted to the semiconductor chips, and
the chip identification information is outputted from the semiconductor chips,
wherein, at a corresponding transmission unit, the semiconductor chip in the present stage counts up its chip identification information upon detection of power-on and then transmits it to the semiconductor chip in the next stage,
wherein a number of electrodes equal to or more than a number of bits by which the semiconductor chips can be identified are provided for each of the semiconductor chips,
wherein the corresponding transmission unit inverts bit information corresponding to an electrode in N-th stage according to transmission of bit information for $2^{N-1}$ layers between the semiconductor chips, N being an integer of 2 or more,
wherein the corresponding transmission unit includes a decode unit that, based on first bit information sent from a semiconductor chip in a previous stage to an electrode in the previous stage of the semiconductor chip in the present stage and second bit information sent from the semiconductor chip in the previous stage to an electrode in the present stage of the semiconductor chip in the present stage, generates third bit information to be sent to the electrode in the present stage of the semiconductor chip in the next stage,
wherein the decode unit includes
an EXOR circuit that generates the third bit information based on an exclusive OR of the first bit information and the second bit information, and
a drive circuit that sets the second bit information to a reset state upon detection of power-off,
wherein the drive circuit cancels the reset state upon detection of power-on and transmits the second bit information, and
wherein drive circuit includes
a NAND circuit that generates the second bit information based on a negative AND of the third bit information and a power-on detection signal, and
a MOS transistor that, when an output from the NAND circuit is applied to a gate, pulls down an input potential of the NAND circuit into which the third bit information is input.

2. The semiconductor device according to claim 1, wherein, at the corresponding transmission unit, the semiconductor chip in the present stage resets its chip identification information upon detection of power-off.

3. The semiconductor device according to claim 1, comprising a register that is provided for each of the semiconductor chips to hold the chip identification information of the semiconductor chip in the present stage.

4. The semiconductor device according to claim 1, comprising a control unit that is provided for each of the semiconductor chips to identify in which layer the semiconductor chip in the present stage resides based on the chip identification information.

5. The semiconductor device according to claim 1, comprising a controller that inputs the external signal into the semiconductor chips, wherein
the external signal is any one of an address latch enable signal, a command latch enable signal, a read enable signal, a write enable signal, a data signal, a data strobe signal, a chip enable signal, a write protect signal, a ready/busy signal, or a chip address, and
the chip identification information is outputted from the semiconductor chips to the controller.

* * * * *